United States Patent
Kim et al.

(10) Patent No.: US 11,354,188 B2
(45) Date of Patent: Jun. 7, 2022

(54) DATA PROCESSING SYSTEM INCLUDING HOST WITH RELIABILITY MANAGEMENT OF MEMORY SYSTEMS AND METHOD FOR THE SAME

(71) Applicant: SK hynix Inc., Gyeonggi-do (KR)

(72) Inventors: Jongryool Kim, San Jose, CA (US); Hyung Jin Lim, San Jose, CA (US); Miseon Han, San Jose, CA (US); Myeong Joon Kang, San Jose, CA (US); Suchang Kim, San Jose, CA (US); Pui York Wong, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/029,975

(22) Filed: Sep. 23, 2020

(65) Prior Publication Data

US 2022/0091931 A1 Mar. 24, 2022

(51) Int. Cl.
*G06F 11/10* (2006.01)
*G06F 11/07* (2006.01)
*G11C 11/406* (2006.01)

(52) U.S. Cl.
CPC ...... *G06F 11/1068* (2013.01); *G06F 11/0781* (2013.01); *G06F 11/1044* (2013.01); *G06F 11/1076* (2013.01); *G11C 11/40615* (2013.01)

(58) Field of Classification Search
CPC ............. G06F 11/1068; G06F 11/0781; G06F 11/1044; G06F 11/1076; G11C 11/40615
USPC .......................... 714/764, 763, 762, 765, 767
See application file for complete search history.

(56) References Cited

U.S. PATENT DOCUMENTS

| | | | |
|---|---|---|---|
| 6,826,123 B1* | 11/2004 | Herring | G06F 1/12 368/46 |
| 10,108,450 B2 | 10/2018 | Pinto et al. | |
| 2005/0078708 A1* | 4/2005 | Bender | H04L 49/3009 370/475 |
| 2005/0080869 A1* | 4/2005 | Bender | H04L 45/28 709/212 |
| 2005/0080920 A1* | 4/2005 | Bender | H04L 67/1097 709/236 |
| 2005/0080933 A1* | 4/2005 | Herring | H04L 12/00 709/249 |

(Continued)

OTHER PUBLICATIONS

Tai, A et al., Who's Afraid of Uncorrectable Bit Errors? Online Recovery of Flash Errors with Distributed Redundancy, 2019, pp. 977-991, 2019 USENIX Association, USENIX Annual Technical Conference, WA, USA.

(Continued)

*Primary Examiner* — Kyle Vallecillo
(74) *Attorney, Agent, or Firm* — IP & T Group LLP

(57) ABSTRACT

A host handles reliability management of memory systems. The host analyzes characteristics of data associated with a select memory system among the memory systems. The host determines a reliability control mode and one or more reliability schemes among reliability schemes to be applied to the select memory system based on the characteristics. The host provides reliability management information indicating the reliability control mode to the select memory system. The plurality of reliability schemes includes error correction code (ECC), read retry, intra redundancy and refresh schemes.

20 Claims, 8 Drawing Sheets

800

810
Analyze characteristics of data associated with a select memory system among the plurality of memory systems 820
Determine a reliability control mode for controlling at least one reliability scheme among a plurality of reliability schemes based on the characteristics 830
Provide reliability management information indicating the reliability control mode to the select memory system

(56) References Cited

U.S. PATENT DOCUMENTS

| | | | | |
|---|---|---|---|---|
| 2005/0080945 | A1* | 4/2005 | Carroll | H04L 49/55 |
| | | | | 710/33 |
| 2006/0109805 | A1* | 5/2006 | Malamal Vadakital | |
| | | | | H04L 65/607 |
| | | | | 370/299 |
| 2014/0192583 | A1* | 7/2014 | Rajan | G11C 5/06 |
| | | | | 365/63 |
| 2019/0179570 | A1 | 6/2019 | Bahirat et al. | |
| 2019/0295665 | A1* | 9/2019 | Kojima | G11C 16/32 |
| 2019/0385057 | A1* | 12/2019 | Litichever | G06N 3/08 |
| 2020/0019346 | A1 | 1/2020 | Wu et al. | |
| 2020/0303018 | A1* | 9/2020 | Takizawa | H01L 27/11582 |
| 2021/0014539 | A1* | 1/2021 | Gao | H04N 21/2662 |

OTHER PUBLICATIONS

Ganesan et al., Redundancy does not imply fault tolerance: Analysis of distributed storage reactions to single errors and corruptions, pp. 149-165, 2017, USENIX Association, 15th USENIX Conference on File and Storage Technologies, CA, USA.

Alagappan et al., Protocol Aware Recovery for Consensus-Based Storage, pp. 15-31,2018, USENIX Association, 16th USENIX Conference on File and Storage Technologies, CA, USA.

Kim et al., Design Tradeoffs for SSD Reliability, pp. 281-294, 2019, USENIX Association, 17th USENIX Conference on File and Storage Technologies, MA, USA.

Maneas S et al., A study of SSD Reliability in Large Scale Enterprise Storage Deployments, pp. 137-149, 2020, USENIX Association, 18th USENIX Conference on File and Storage Technologies, CA, USA.

Brewer E et al., Google Technical Report 2016—Disk for data centers, 2016, pp. 1-16, Version 1.1., Google Inc.

* cited by examiner

- F1 : ECC
- F2 : Read Retry
- F3 : RAID
- F4 : Refresh

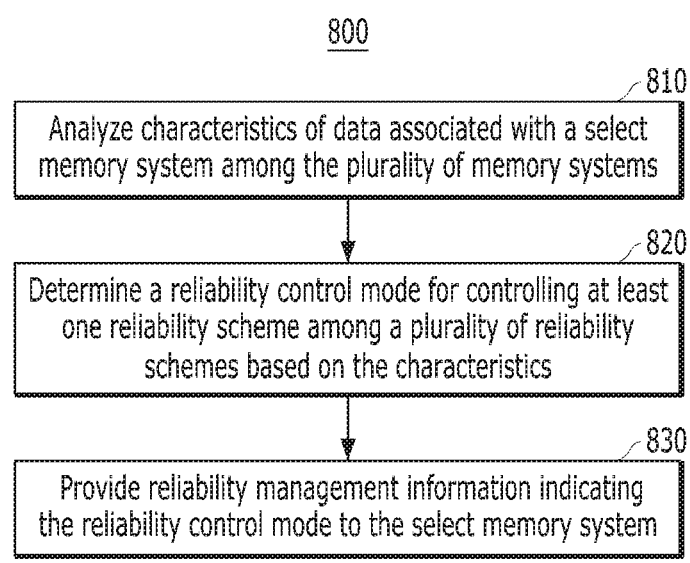

FIG. 9A

```
API ( mode, coverage, (optional) id )
 mode :
  1 : default mode
  2 : detection mode
  3 : archiving mode
  4 : read many mode
 coverage :
  1 : SSD
  2 : Namespace
  3 : NVMe set
  4 : Zone
 id (optional) :
  namespace title (for 2 : Namespace),
  NVMe Set ID (for 3 : NVMe set),
  zone ID (for 4 : ZNS)

return
  -1 : fail
  0 : success
```

FIG. 9B

```
Manual API ( mode, coverage, (optional) id, reliability-scheme, control )
 mode :
   1 : default mode
 coverage :
   1 : SSD
   2 : Namespace
   3 : NVMe set
   4 : Zone
   5 : die
   6 : channel
 id (optional) :
   namespace title (for 2 : Namespace),
   NVMe Set ID (for 3 : NVMe set),
   zone ID (for 4 : ZNS)
   die ID (for 5 : die)
   channel ID (for 6 : channel)
 reliability-scheme :
   ECC : ECC
   RETRY : read retry
   RAID : intra-redundancy
   REFRESH
 control :
   for ECC
      0 : off
      1 : on
      2 : low strength (BHC, low parity)
      3 : high strength (LDPC, high parity)
   for RETRY
      number : the number of max retry count
   for RAID
      0 : off
      1 : on
      number : stripe size
   for REFRESH
      0 : off
      1 : on
      number : the number of max frequency return
   -1 : fail
    0 : success
```

DATA PROCESSING SYSTEM INCLUDING HOST WITH RELIABILITY MANAGEMENT OF MEMORY SYSTEMS AND METHOD FOR THE SAME

BACKGROUND

1. Field

Embodiments of the present disclosure relate to a scheme for managing reliability of memory systems.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs).

System reliability is one of the most important aspects of memory systems. If memory systems have better capability of handling reliability of stored data therein, the performance and quality of service (QoS) of such memory systems may be improved. Thus, memory systems with better reliability management is desired. In this context, embodiments of the present invention arise.

SUMMARY

Aspects of the present invention include a data processing system including a host capable of handling reliability management of memory systems and a reliability management method thereof.

In one aspect, a data processing system includes a plurality of memory systems and a host including a reliability manager coupled to the plurality of memory systems. The reliability manager is configured to analyze characteristics of data associated with a select memory system among the plurality of memory systems; determine a reliability control mode and one or more reliability schemes among a plurality of reliability schemes to be applied to the select memory system based on the characteristics; and provide reliability management information indicating the reliability control mode to the select memory system. The plurality of reliability schemes includes error correction code (ECC), read retry, intra redundancy and refresh schemes.

In another aspect, a method for operating a host coupled to a plurality of memory systems includes: analyzing characteristics of data associated with a select memory system among the plurality of memory systems; determining a reliability control mode and one or more reliability schemes among a plurality of reliability schemes to be applied to the select memory system based on the characteristics; and providing reliability management information indicating the reliability control mode to the select memory system. The plurality of reliability schemes includes error correction code (ECC), read retry, intra redundancy and refresh schemes.

Additional aspects of the present invention will become apparent from the following description.

BRIEF DESCRIPTION OF THE DRAWINGS

FIG. 8 is a flowchart illustrating a reliability management method in accordance with an embodiment of the present invention.

FIGS. 9A and 9B are diagrams illustrating examples of reliability management information by application program interfaces (APIs) of a reliability manager in accordance with an embodiment of the present invention.

DETAILED DESCRIPTION

Figure 1:
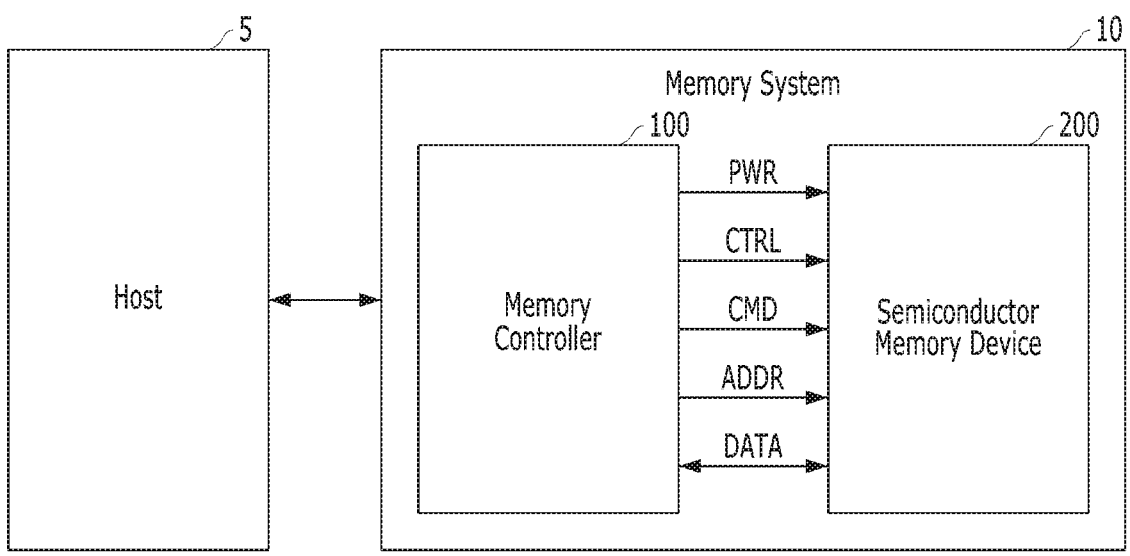
FIG. 1 is a block diagram illustrating a data processing system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any one of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any one of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operation of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDRC), and/or a universal flash storage (UFS).

Figure 2:
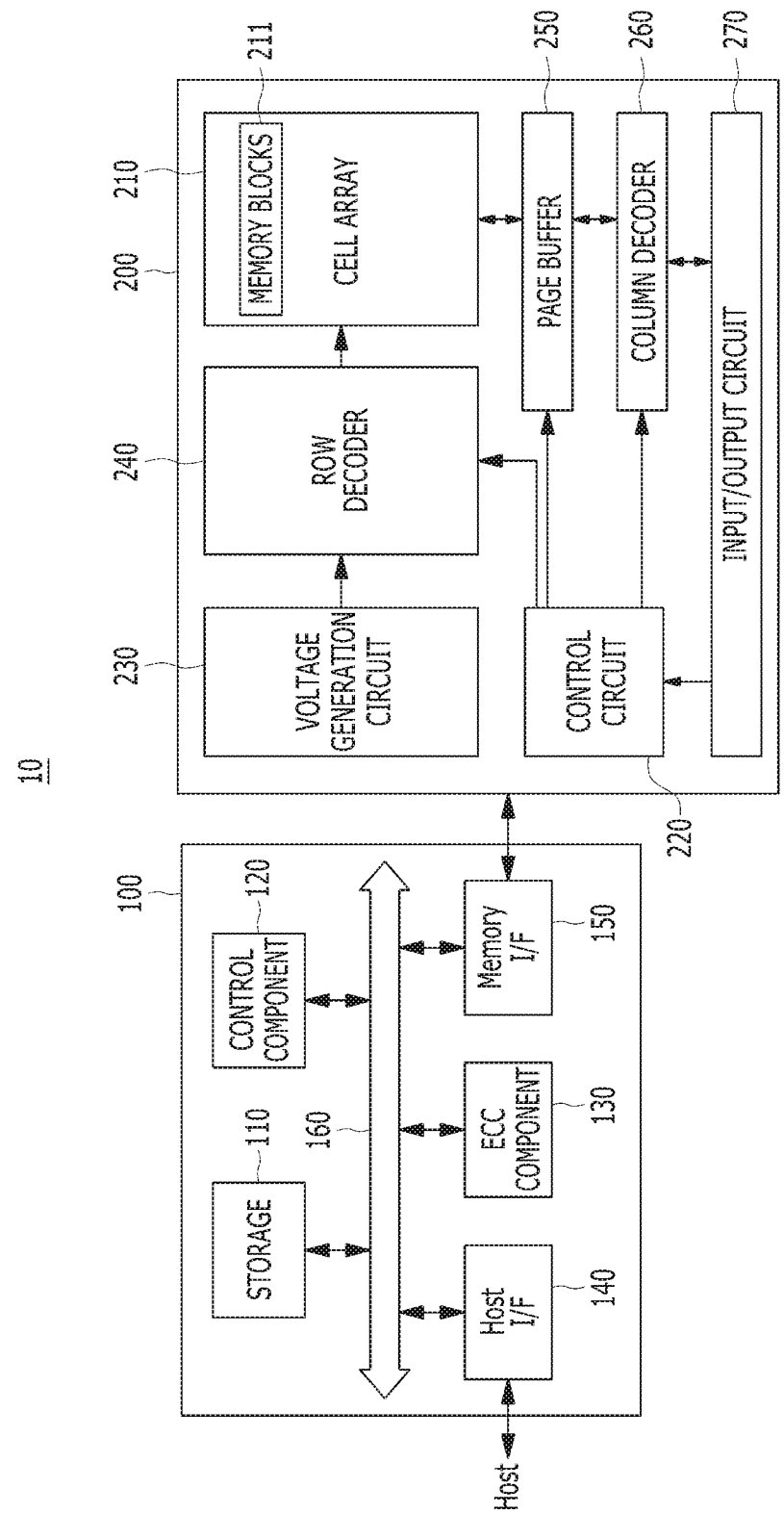
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operation of the memory system 10, and in particular a write operation and a read operation for the memory device 200, in response to a corresponding request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and/or an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation on the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
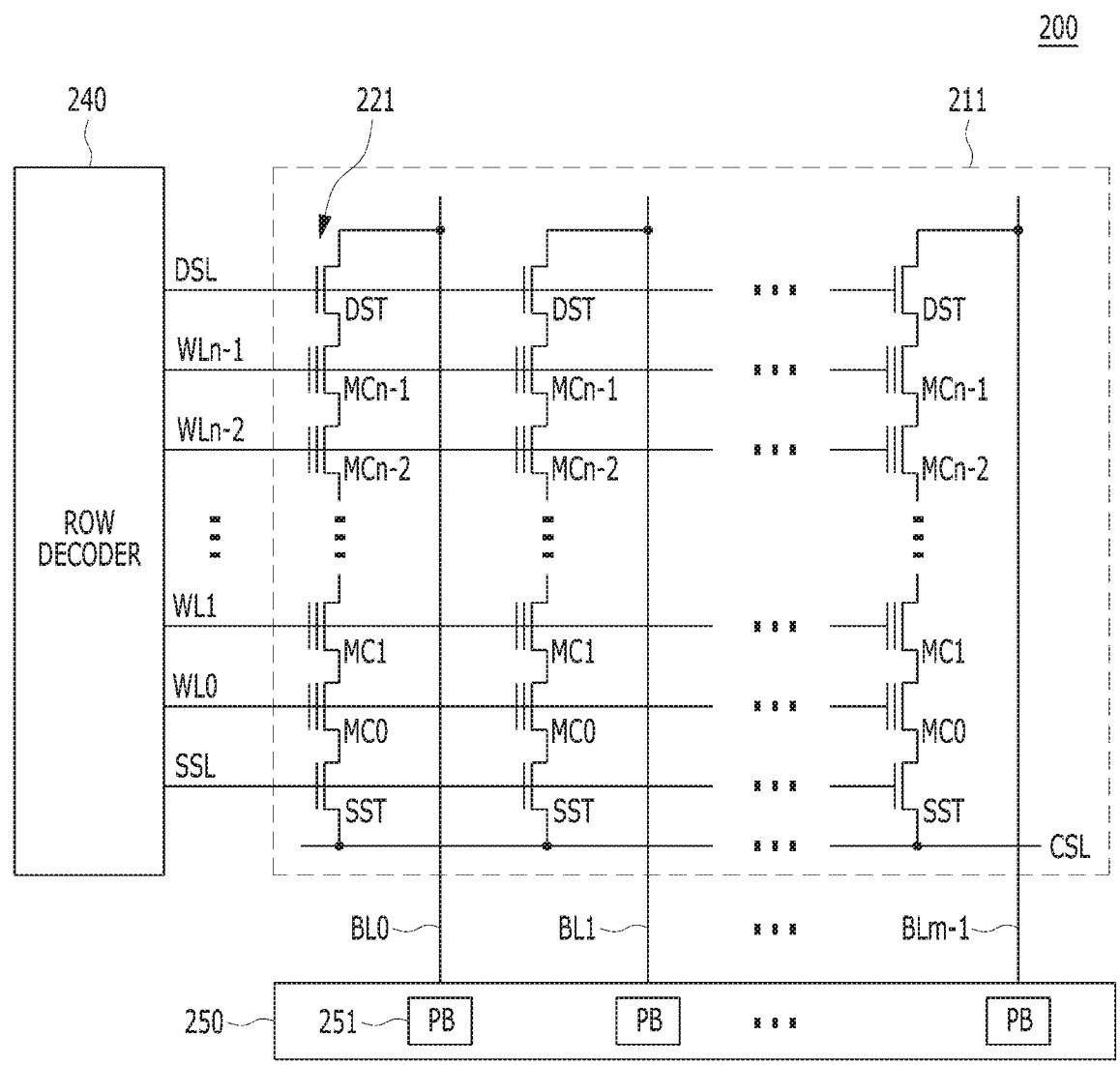
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a single level cell (SLC) storing 1 bit of data, a multi-level cell (MLC) storing 2 bits of data, a triple-level cell (TLC) storing 3 bits of data, or a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 my temporarily store data received through the bit lines BL0 to BLm−1 or sense voltages or currents of the bit lines during a read or verify operation.

In some embodiments, the memory blocks 211 may include NAND-type flash memory cells. However, the memory blocks 211 are not limited to such cell type, but may include NOR-type flash memory cells. Memory cell array 210 may be implemented as a hybrid flash memory in which two or more types of memory cells are combined, or one-NAND flash memory in which a controller is embedded inside a memory chip.

As described above, memory systems such as a solid state drive (SSD) may store data. Replacement of an SSD can be triggered for different reasons. Also, sub-systems in the storage hierarchy can detect issues that trigger the replacement of drives. For example, issues might be reported by the drive itself, the storage layer, or the file system. Inventors observed that replacement of SSDs is triggered for various types of reasons, i.e., predictive failures, threshold exceeded, recommended failures, aborted commands, disk ownership input and output (I/O) errors, command timeouts, lost writes, small computer system interface (SCSI) errors, unresponsive drive, as shown in List 1.

| | List 1 | |
|---|---|---|
| Category | Type | Percentage (%) |
| SL1 | Predictive Failures | 12.78 |
| | Threshold Exceeded | 12.73 |
| | Recommended Failures | 8.93 |
| SL2 | Aborted Commands | 13.56 |
| | Disk Ownership I/O Errors | 3.27 |
| | Command Timeouts | 1.81 |
| SL3 | Lost Writes | 13.54 |
| SL4 | SCSI Errors | 32.78 |
| | Unresponsive Drive | 0.60 |

With reference to List 1 above, it can be seen that SCSI errors are the most common. SCSI errors are associated with bit errors of stored data in SSDs. Accordingly, it is desirable to provide a scheme capable of managing reliability of memory systems (e.g., SSDs) such that the performance (e.g., tail latency, write amplification) and quality of service (QoS) of memory systems may be improved.

Embodiments provide a data processing system including a host capable of managing reliability of memory systems and a reliability management method thereof. In accordance with embodiments, the host may determine whether to apply one or more reliability schemes to associated memory systems based on characteristics of data and apply to the memory systems the reliability scheme(s) deemed appropriate based on the determination. Accordingly, embodiments may improve the performance and quality of service (QoS) of memory systems.

Figure 4:
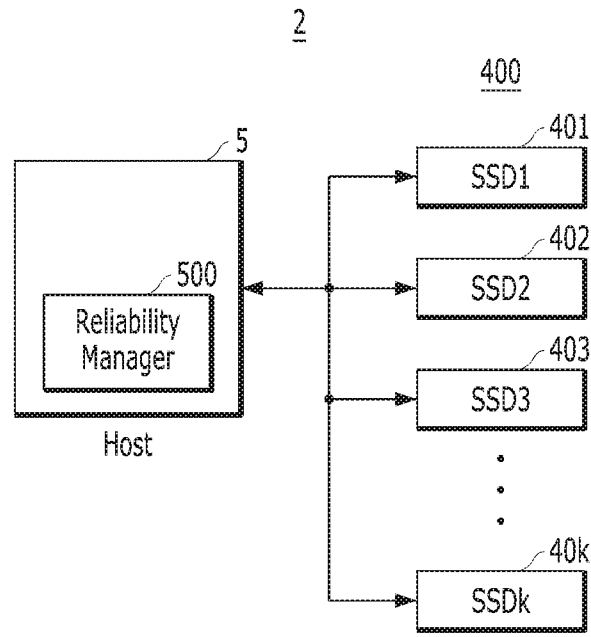
FIG. 4 is a diagram illustrating a data processing system including a host with reliability management of memory systems in accordance with an embodiment of the present invention.

FIG. 4 is a diagram illustrating a data processing system 2 in accordance with an embodiment of the present invention.

Referring to FIG. 4, the data processing system 2 may include a host 5 and solid state drives (SSDs) 401-40k as memory systems 400, which are coupled to the host 5. The host 5 may include a reliability manager 500 which performs reliability management for SSDs 401-40k. SSDs 401-40k may be host manageable reliable (HMR) SSDs.

The reliability manager 500 may analyze characteristics of data associated with a select memory system among the plurality of memory systems (i.e., SSDs 401-40k).

In some embodiments, the characteristics include data pattern and/or data priority. For example, data pattern indicates a frequency of data access of certain data relative to other data and a type of data (e.g., read or write). Data accessed at a high frequency may be considered hot data, whereas data accessed at a low frequency may be considered cold data. Regarding data priority, meta data may have a relatively high priority and normal data (i.e., non meta data) may have a relatively low priority.

The reliability manager 500 may determine a reliability control mode for controlling at least one reliability scheme among a plurality of reliability schemes based on the characteristics of the data of the select memory system. In some embodiments, one or more reliability schemes are determined based on the reliability control mode. The reliability manager 500 may provide reliability management information indicating the reliability control mode to the select memory system.

In some embodiments, the plurality of reliability schemes may include error correction code (ECC), read retry, intra redundancy and refresh schemes. In the ECC scheme on and off (on/off) of an ECC algorithm (e.g., Bose-Chaudhuri-Hocquenghem (BCH), low density parity check (LDPC)) and code strength (i.e., low strength, high strength) may be controlled. The read retry scheme may control a maximum retry count and a retry scale factor. The intra redundancy scheme may control on/off of intra redundancy (e.g., redundant arrays of inexpensive disks (RAID)) and a stripe size (i.e., strength) associated with RAID. The refresh scheme may control on/off of refresh of data and frequency (or a maximum frequency) of refresh. The refresh scheme may include one or more of remapping-based refresh, in-place refresh and a read reclaim.

In some embodiments, any of various reliability control modes may be applied, including a default mode, a detection mode (or a detection only mode), an archiving mode and a read-many mode (or a write once read many (WORM) mode).

In the default mode, one or more of ECC, read retry, intra redundancy and refresh schemes may be used. In the default mode, the reliability manager 500 may notify SSDs 401-40k of which of these default reliability schemes are used.

The detection-only mode may involve activating error detection and deactivating error correction. In the detection-only mode, the reliability manager 500 may notify a user of data associated with error detection and error(s) that occur in the data.

In the archiving mode, intra redundancy and refresh schemes may be used. In the archiving mode, the reliability manager 500 may increase a stripe size associated with RAID or decrease a strength associated with RAID. Further, the reliability manager 500 may increase a period during which refresh is performed.

In the read-many mode, the refresh scheme may be used. In the read-many mode, the reliability manager 500 may increase a period of refresh and decrease a maximum retry count of a read retry.

As described above, the reliability manager 500 may determine a reliability control mode based on the characteristics of the data of the select memory system, and determine one or more reliability scheme among the plurality of reliability schemes based on the reliability control mode, as shown in List 2. In some embodiments, the host 5 or a user may determine an appropriate reliability control mode based on the user's workload associated with the select memory system. For example, the host 5 may provide application program interfaces (APIs) and a user may use APIs of the host 5 to select a specific mode, as shown in FIGS. 9A and 9B.

List 2

| Data characteristics | Reliability control mode | Intra Redundancy | Refresh |
|---|---|---|---|
| Cold data | Archiving Mode | Stripe size (+) Strength (−) | Refresh (+) |
| Read heavy data | Read Many mode | | Refresh (+) Max retry count (−) |

Referring to List 2, when the data of the select memory system is cold data, the reliability manager 500 determines the archiving mode as a reliability control mode. In the archiving mode, the reliability manager 500 selects the intra redundancy and refresh schemes and controls values (e.g., increase (+) a stripe size and decrease (−) a strength) for the intra redundancy scheme and values (e.g., increase (+) a frequency of refresh) for the refresh scheme. When the data of the select memory system is read heavy data, the reliability manager 500 determines the read-many mode as a reliability control mode. In the read-many mode, the reliability manager 500 selects the refresh scheme and controls values (e.g., increase (+) a frequency of refresh and decrease (−) a maximum read retry count) for the refresh scheme.

In some embodiments, the reliability management information may include coverage information indicating the extent of the select memory system to which the reliability management is to be applied. In an embodiment, the coverage may indicate that the entirety of select memory system is to be subjected to reliability management. In another embodiment, the coverage may indicate that only certain part(s) of the select memory system, such as one or more namespaces (NSs), NVMe sets, zones, dies and channels in the select memory system, are to be subjected to reliability management. The reliability manager 500 may select more than one memory system and apply the same coverage to all selected memory systems, i.e., SSDs 401-40k. Alternatively, when multiple memory systems are selected, the reliability manager 500 may apply different coverages to different memory systems, i.e., each of the SSDs 401-40k may be covered differently.

As described above, the reliability manager 500 of the host 5 may determine whether to apply one or more reliability schemes to SSDs 401-40k based on characteristics of data and apply to SSDs 401-40k the reliability scheme(s) determined to be appropriate.

For meta data, which has a higher priority than normal data, the reliability manager 500 may determine appropriate reliability schemes associated with the meta data for memory systems and control values or parameters of appropriate reliability schemes, e.g., adjust (e.g., increase) values of ECC and RAID, such that occurrence of errors in the meta data is reduced and integrity of the meta data is increased. Accordingly, embodiments may improve the performance and quality of service (QoS) of memory systems.

Figure 5:
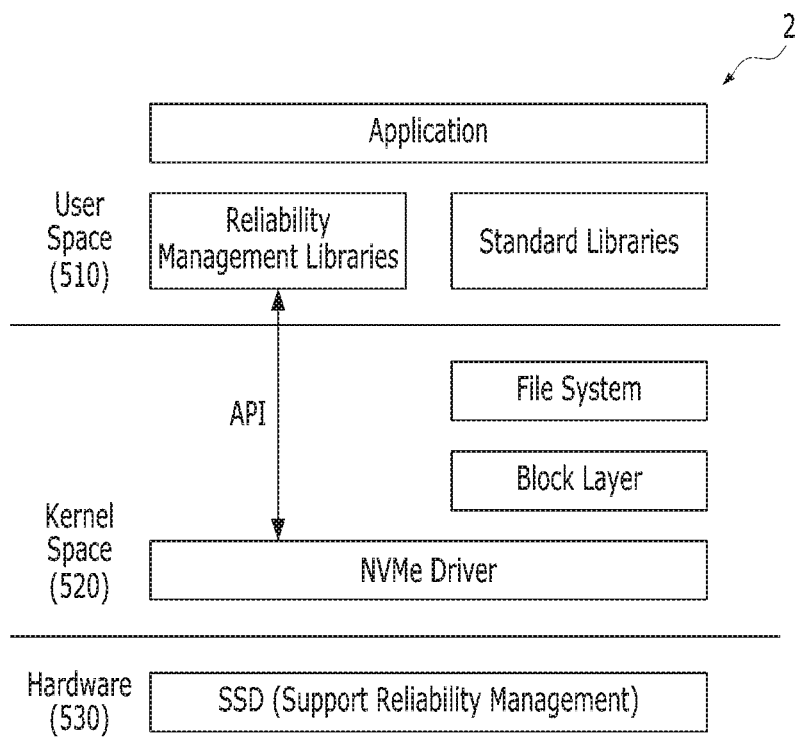
FIG. 5 is a diagram illustrating an architecture of a data processing system in accordance with an embodiment of the present invention.

FIG. 5 is a diagram illustrating an architecture of a data processing system 2 in accordance with an embodiment of the present invention.

Referring to FIG. 5, the data processing system 2 may include a user space 510, a kernel space 520 and a hardware 530. The user space 510 and the kernel space 520 may indicate software components of the host 5 and/or SSDs 401-40k in FIG. 4. In a typical manner, the user space 510 may include application and standard libraries and the kernel space 520 may include a file system, a block layer and a device driver (e.g., a NVMe driver). The hardware 530 may represent hardware components of SSDs 401-40k in FIG. 4. Each SSD may support reliability management.

In an embodiment, the user space 510 may include reliability management libraries. For reliability management of the hardware 530 (i.e., SSDs 401-40k), the application associated with the reliability manager 500 in FIG. 4 may call application programming interfaces (APIs) and the APIs may be provided to the hardware 530 through the NVMe driver.

Figure 6:
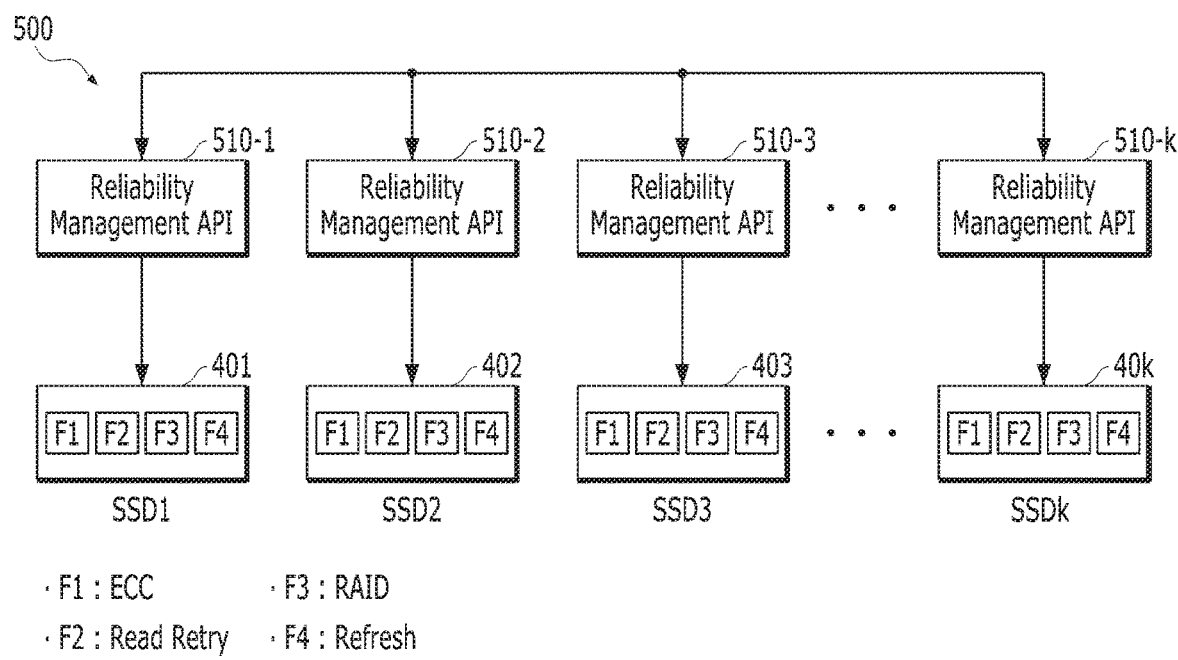
FIG. 6 is a diagram illustrating application programming interfaces (APIs) of a reliability manager in accordance with an embodiment of the present invention.

FIG. 6 is a diagram illustrating application programming interfaces (APIs) of a reliability manager 500 in accordance with an embodiment of the present invention.

Referring to FIG. 6, the reliability manager 500 may include a plurality of reliability management APIs 510-1 to 510-k. Reliability management APIs 510-1 to 510-k may respectively correspond to SSDs 401-40k. In other words, the reliability management API 510-1 may correspond to SSD 401, the reliability management API 510-2 may correspond to SSD 402, the reliability management API 510-3 may correspond to SSD 403, and the reliability management API 510-k may correspond to SSD 40k.

Each SSD may support one or more reliability schemes among a plurality of reliability schemes. In other words, each SSD may be a host manageable reliable (HMR) SSD. In some embodiments, the plurality of reliability schemes may include error correction code (ECC) F1, read retry F2, intra redundancy (e.g., RAID) F3 and refresh schemes F4. ECC and intra redundancy schemes F1 and F3 are associated with hardware reliability management of SSD. Read retry and refresh schemes F2 and F4 are associated with software reliability management of SSD.

Figure 7:
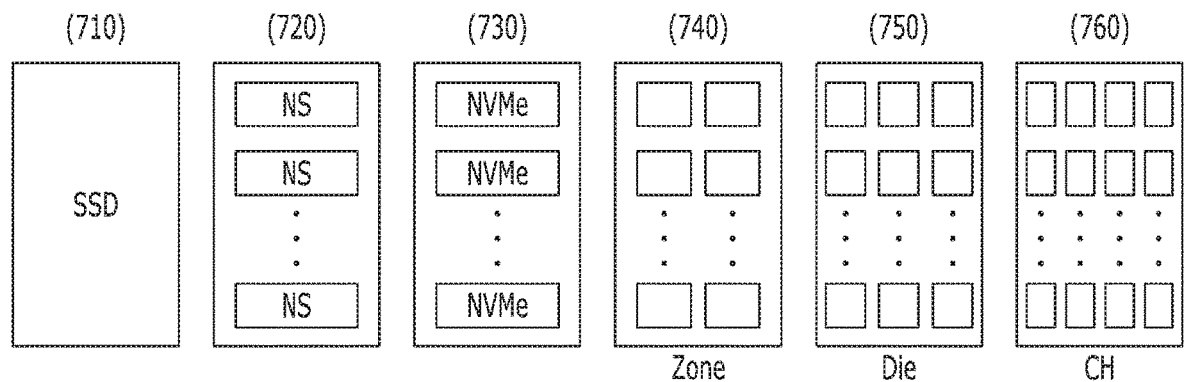
FIG. 7 is a diagram illustrating coverage units of a solid state drive (SSD), which are controlled by a reliability manager, in accordance with an embodiment of the present invention.

FIG. 7 is a diagram illustrating units of a solid state drive (SSD) that are covered by operations performed by a reliability manager 500, in accordance with an embodiment of the present invention.

Referring to FIG. 7, the reliability manager 500 may manage which elements/components of each memory system (i.e., SSD) are covered in terms of the reliability operations. In an embodiment, the coverage may extend to the entire SSD 710. In another embodiment, the coverage may extend to only a part of SSD, such as one or more namespaces (NSs) 720, one or more NVMe sets 730, one or more zones 740, one or more dies 750 and one or more channels (CHs) 760. In some embodiments, the reliability manager 500 may cover all of the SSDs to the same extent or may cover different SSDs differently. In the latter case, certain components/elements of one SSD may be covered but those same components/elements in another SSD are not covered.

FIG. 8 is a flowchart illustrating a reliability management method 800 in accordance with an embodiment of the present invention.

Referring to FIG. 8, the reliability management method 800 may be performed by the reliability manager 500 in FIGS. 4-6 and may be used for a plurality of memory systems (e.g., SSDs).

In operation 810, the reliability manager 500 may analyze characteristics of data associated with a select memory system among the plurality of memory systems.

In some embodiments, the characteristics include data pattern and/or data priority. For example, in terms of data pattern, the reliability manager 500 may analyze access frequency of certain data relative to other data and/or type of data (e.g., read or write), e.g., ratio of read to write data. Data may also be analyzed in terms of priority. Certain data may have a relatively high priority and other data may have a relatively low priority, and the relative amounts of these two types of data may be analyzed.

In operation 820, the reliability manager 500 may determine a reliability control mode for controlling at least one reliability scheme among a plurality of reliability schemes based on the characteristics. In operation 830, the reliability manager 500 may provide reliability management information indicating the reliability control mode to be used to the select memory system.

In some embodiments, the plurality of reliability schemes may include error correction code (ECC), read retry, intra redundancy and refresh schemes.

In some embodiments, the reliability control mode may include a default mode, a detection mode (or a detection only mode), an archiving mode and a read-many mode (or a write once read many (WORM) mode).

In some embodiments, the reliability management information may include coverage information indicating what portion of the select memory system the reliability control mode is to be applied. In an embodiment, the reliability control mode may be applied to the entire select memory system. In another embodiment, the reliability control mode may only be applied to a part of the select memory system, such as one or more namespaces (NSs), NVMe sets, zones, dies and channels in the select memory system.

FIGS. 9A and 9B show examples of reliability management information implemented by application program interfaces (APIs), which are used by a reliability manager 500 to perform reliability management, in accordance with an embodiment of the present invention. In some embodiments, the host 5 may provide APIs and a user may use APIs to select a specific mode, as shown in FIGS. 9A and 9B. Each API may provide a select memory system (e.g., SSD) on which reliability management is to be performed with information regarding which reliability control mode is to be applied, along with coverage information. When the coverage is less than the entire SSD, additional information may be provided as to which part(s) are to be subjected to reliability management.

Referring to FIG. 9A, reliability management information may include mode information and coverage information. In the illustrated example, mode information may indicate a default mode ("1"), a detection mode (or a detection only mode) ("2"), an archiving mode ("3") or a read-many mode (or a write once read many (WORM) mode) ("4"). In the illustrated example, coverage information may indicate coverage of the select SSD, i.e., the entire select SSD ("1") or part(s) of the select SSD such as one or more namespaces (NSs) ("2"), NVMe sets ("3") and zones ("4") in the select SSD.

When a reliability scheme is applied to only part(s) of the select SSD, reliability management information may further include title or identifier (ID) for the part(s) of the select SSD such as namespace ("2"), NVMe set ("3") and zone ("4").

Referring to FIG. 9B, reliability management information may be manually generated by a user. Reliability management information may include mode information and coverage information.

In the illustrated example, a default mode ("1") is set and different reliability schemes such as ECC, read retry (i.e., RETRY), intra redundancy (i.e., RAID) and refresh schemes also may be set.

For the default mode ("1"), coverage information may indicate how much of the select SSD is to be subjected to reliability management, ranging from the entire select SSD ("1") or part(s) of the select SSD, which are identified by one or more namespaces (NSs) ("2"), NVMe sets ("3"), zones ("4"), dies ("5") and channels ("6") in the select SSD.

When a reliability scheme is used for only a portion of the select SSD, reliability management information may further include an identifier (ID) for the part(s) of the select SSD such as namespace ("2"), NVMe set ("3"), zone ("4"), die ("5") and channel ("6").

For the ECC scheme, on and off (on/off) of an ECC algorithm and a code strength may be set. "0" represents that the ECC algorithm is off. "1" represents that the ECC algorithm is on. "2" represents that the ECC (BCH, low parity) is low strength. "3" represents that the ECC (LDPC, high parity) is high strength.

For the read retry (i.e., RETRY) scheme, the maximum number of retries, i.e., a maximum retry count, may be set.

For the intra redundancy (i.e., RAID) scheme, on/off of intra redundancy (e.g., redundant arrays of inexpensive disks (RAID)) and a stripe size (i.e., strength) associated with RAID may be set. "0" represents that the RAID scheme is off. "1" represents that the RAID scheme on. for a numerical value representing the stripe size may be set.

For the refresh scheme, on/off of the refresh scheme and a period (or a maximum frequency) of the refresh scheme may be set. "0" represents that the refresh scheme is off. "1" represents that the refresh scheme is on. The maximum frequency at which the refresh scheme is applied may be set in terms of a numerical value.

As described above, embodiments provide a host capable of managing reliability of memory systems and a reliability management method thereof. The host determines appropriate reliability schemes associated with data for memory systems and control values of appropriate reliability schemes. Accordingly, embodiments may improve the performance and quality of service (QoS) of memory systems.

Although the present invention has been illustrated and described in the context of various embodiments, the present invention is not limited to any embodiment nor to any particular details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A data processing system comprising:
   a plurality of memory systems; and a host including a reliability manager coupled to the plurality of memory systems and configured to:

analyze characteristics of data associated with a select memory system among the plurality of memory systems;

determine a reliability control mode and one or more reliability schemes among a plurality of reliability schemes to be applied to the select memory system based on the characteristics; and provide reliability management information indicating the reliability control mode to the select memory system, wherein the plurality of reliability schemes includes error correction code (ECC), read retry, intra redundancy and refresh schemes.

2. The data processing system of claim 1, wherein the characteristics include at least one of data pattern and data priority.

3. The data processing system of claim 2, wherein the data pattern includes access frequency of data and a type of data.

4. The data processing system of claim 1, wherein the ECC scheme includes controlling on and off of an ECC algorithm and a code strength.

5. The data processing system of claim 1, wherein the read retry scheme includes controlling a maximum retry count and a retry scale factor.

6. The data processing system of claim 1, wherein the intra redundancy scheme includes controlling on and off of redundant arrays of inexpensive disks (RAID) and a stripe size associated with RAID.

7. The data processing system of claim 1, wherein the refresh scheme includes controlling on and off of refresh of data and a period of refresh.

8. The data processing system of claim 1, wherein the reliability control mode includes a default mode, a detection mode, an archiving mode and a read-many mode,
   wherein, in the default mode, one or more of ECC, read retry, intra redundancy and refresh schemes are set and applied,
   wherein, in the detection mode, error detection is controlled,
   wherein, in the archiving mode, the intra redundancy and refresh schemes are controlled and applied, and
   wherein, in the read-many mode, the refresh scheme is controlled and applied.

9. The data processing system of claim 1, wherein the reliability management information includes coverage information indicating which portion up to and including all of the select memory system the reliability control mode is to be applied.

10. The data processing system of claim 9, wherein, when the coverage information indicates that a portion of the select memory system is covered, the coverage information further includes information on which of one or more parts of the select memory system are covered.

11. A method for operating a host coupled to a plurality of memory systems, the method performed by a reliability manager of the host comprising:

analyzing characteristics of data associated with a select memory system among the plurality of memory systems;

determining a reliability control mode and one or more reliability schemes among a plurality of reliability schemes to be applied to the select memory system based on the characteristics; and providing reliability management information indicating the reliability control mode to the select memory system, wherein the plurality of reliability schemes includes error correction code (ECC), read retry, intra redundancy and refresh schemes.

12. The method of claim 11, wherein the characteristics include at least one of data pattern and data priority.

13. The method of claim 12, wherein the data pattern includes access frequency of data and a type of data.

14. The method of claim 11, wherein the ECC scheme includes controlling on and off of an ECC algorithm and a code strength.

15. The method of claim 11, wherein the read retry scheme includes controlling a maximum retry count and a retry scale factor.

16. The method of claim 11, wherein the intra redundancy scheme includes controlling on and off of redundant arrays of inexpensive disks (RAID) and a stripe size associated with RAID.

17. The method of claim 11, wherein the refresh scheme includes controlling on and off of refresh of data and a period of refresh.

18. The method of claim 11, wherein the reliability control mode includes a default mode, a detection mode, an archiving mode and a read-many mode,
   wherein, in the default mode, one or more of ECC, read retry, intra redundancy and refresh schemes are set and applied,
   wherein, in the detection mode, error detection is controlled,
   wherein, in the archiving mode, the intra redundancy and refresh schemes are controlled and applied, and
   wherein, in the read-many mode, the refresh scheme is controlled and applied.

19. The method of claim 11, wherein the reliability management information includes coverage information indicating which portion up to and including all of the select memory system the reliability control mode is to be applied.

20. The method of claim 19, wherein, when the coverage information indicates that a portion of the select memory system is covered, the coverage information further includes information on which of one or more parts of the select memory system are covered.

* * * * *